(12) United States Patent
Tsai

(10) Patent No.: US 7,508,016 B2
(45) Date of Patent: Mar. 24, 2009

(54) CMOS IMAGER HAVING ON-CHIP ROM

(75) Inventor: Richard H. Tsai, Arcadia, CA (US)

(73) Assignee: Micron Technology, Inc., Boise, ID (US)

( * ) Notice: Subject to any disclaimer, the term of this patent is extended or adjusted under 35 U.S.C. 154(b) by 452 days.

(21) Appl. No.: 11/332,510

(22) Filed: Jan. 17, 2006

(65) Prior Publication Data

US 2006/0175614 A1 Aug. 10, 2006

Related U.S. Application Data

(63) Continuation of application No. 10/222,827, filed on Aug. 19, 2002, now Pat. No. 7,023,031.

(51) Int. Cl.
*H01L 27/10* (2006.01)
*H01L 21/82* (2006.01)

(52) U.S. Cl. .................. 257/209; 257/146; 438/132; 438/467; 438/601

(58) Field of Classification Search ................ 257/209, 257/E31.113, E23.146, 113, 146; 438/132, 438/467, 601; 365/96
See application file for complete search history.

(56) References Cited

U.S. PATENT DOCUMENTS

| | | | |
|---|---|---|---|
| 3,529,299 A | 9/1970 | Chung et al. | |
| 4,064,493 A | 12/1977 | Davis | |
| 4,152,627 A | 5/1979 | Priel et al. | |
| 4,459,497 A | 7/1984 | Kuo et al. | |
| 4,703,442 A | 10/1987 | Levine | |
| 5,536,968 A | 7/1996 | Crafts et al. | |
| 5,537,108 A | 7/1996 | Nathan et al. | |
| 6,293,465 B1 | 9/2001 | Heller et al. | |
| 6,349,064 B1 | 2/2002 | Nakaoka | |
| 6,396,539 B1 | 5/2002 | Heller et al. | |
| 6,442,094 B2 | 8/2002 | Shore | |
| 6,526,366 B1 | 2/2003 | Dunton | |
| 6,670,824 B2 | 12/2003 | Goodbread et al. | |
| 2003/0007081 A1 | 1/2003 | Kwon et al. | |

*Primary Examiner*—David S Blum
(74) *Attorney, Agent, or Firm*—Dickstein Shapiro LLP

(57) ABSTRACT

A CMOS image sensor formed on a chip has a ROM disposed on the chip for recording pixel defect locations, chip-by-chip variations such as bias, and other manufacturing production data. Testing results and repair solutions are written to the ROM after production testing. A simple circuit for writing information to the ROM also is provided on the CMOS chip. During operational use of the image sensor, data is read from the on-chip ROM to assist in compensating for manufacturing process variations.

18 Claims, 2 Drawing Sheets

CMOS IMAGER HAVING ON-CHIP ROM

This application is a continuation of application Ser. No. 10/222,827, filed on Aug. 19, 2002 now U.S. Pat No. 7,023,031, which is hereby incorporated by reference in its entirety.

BACKGROUND OF THE INVENTION

1. Field of the Invention

The present invention relates generally to CMOS image sensors and in particular to a CMOS image sensor provided with an on-chip Read Only Memory (ROM).

2. Brief Description of the Related Art

Image sensing devices are known that employ light detecting elements such as photodiodes or photo-transistors formed using complementary metal oxide semiconductor (CMOS) techniques. The imaging devices generally include an array of pixels containing the light detecting elements arranged on a chip.

Typically, an integrated circuit imaging device formed using a CMOS process has an image sensor pixel array with associated row and column conductors and decoders, an analog signal path including a sample and hold circuit for reading pixel signals from the column conductors, a digital to analog converter for digitizing the analog pixel signals, a controller for controlling array read out operations, a pixel processor for processing digital pixel signals, and an input/output (I/O) port all fabricated on a single chip. The controller manages operation of the read out of the image sensor array, the analog signal path and the analog digital converter, and may also operate as the pixel processor.

During manufacture, each imaging pixel array is usually tested individually. Tests detect defective pixel circuits, pixel signal level, and other array attributes, and the information is stored based on lot and individual device identification numbers. The information developed during testing can be utilized to enhance the operation of the device by, for example, compensating for defective pixels, differing pixel signal levels, and other tested pixel attributes.

U.S. Pat. No. 6,396,539 to Heller et al. discloses a CMOS imager with an on-chip programmable memory for storing pixel and identification information for a CMOS sensor array. The preferred embodiment disclosed by Heller et al., is based on a flash memory, which is complex and bulky. It would be desirable to provide an image sensor having on chip programmable read only memory employing a simple and compact circuit for reading and writing data, and which requires no difficult processing for forming the memory. A simple and easy way to store pixel array information on-chip for later use is also desirable.

SUMMARY OF THE INVENTION

The present invention provides a CMOS image sensor formed on a chip and having a simplified ROM circuit disposed on the same chip for recording pixel information, for example, identification numbers, pixel defect locations, chip-by-chip variations such as pixel signal bias, and/or gain values and other manufacturing and/or test data. Testing results and repair solutions can be written to the ROM during post-production testing. A simple circuit for writing information to, and reading information from, the ROM is also provided.

In an exemplary embodiment, each memory cell of the ROM includes a fusible conductor. The fusible conductors are arranged in an array of rows and columns, with each being connected between a row line and a column line. Preferably, the fusible conductor is formed of polysilicon. Write circuitry is arranged to apply a write voltage selectively to each memory cell through associate row and column conductors, the write voltage being sufficient to break the fusible conductor. Read circuitry applies a read voltage selectively to each memory cell through the associated row and column conductor and determines whether or not the fusible conductor is broken. The write voltage is higher than the read voltage, the read voltage being insufficient to break the fusible conductor. The write circuitry and the read circuitry include an address decoder for the row and column lines for memory cell selection.

In operation, information about the image sensing array such as identification numbers and pixel data obtained during manufacture and/or testing of the pixel array is saved to the on-chip ROM by applying high voltage/current to selected bits. The applied voltage breaks the polysilicon fuse. The broken and unbroken fuses define bit patterns representing the stored information.

These and other features and advantages of the invention will be more clearly understood from the following detailed description which is provided in connection with the accompanying drawings.

BRIEF DESCRIPTION OF THE DRAWINGS

FIG. 3 is a schematic representation of a memory cell fuse used in the imaging sensor of FIG. 1 in accordance with an exemplary embodiment of the invention.

DETAILED DESCRIPTION OF THE INVENTION

In the following detailed description, reference is made to the accompanying drawings which form a part hereof, and in which is shown by way of illustration, specific embodiments in which the invention may be practiced. These embodiments are described in sufficient detail to enable those of ordinary skill in the art to make and use the invention, and it is also understood that structural, logical, or procedural changes may be made to the specific embodiments disclosed without departing from the spirit and scope of the present invention.

Figure 1:
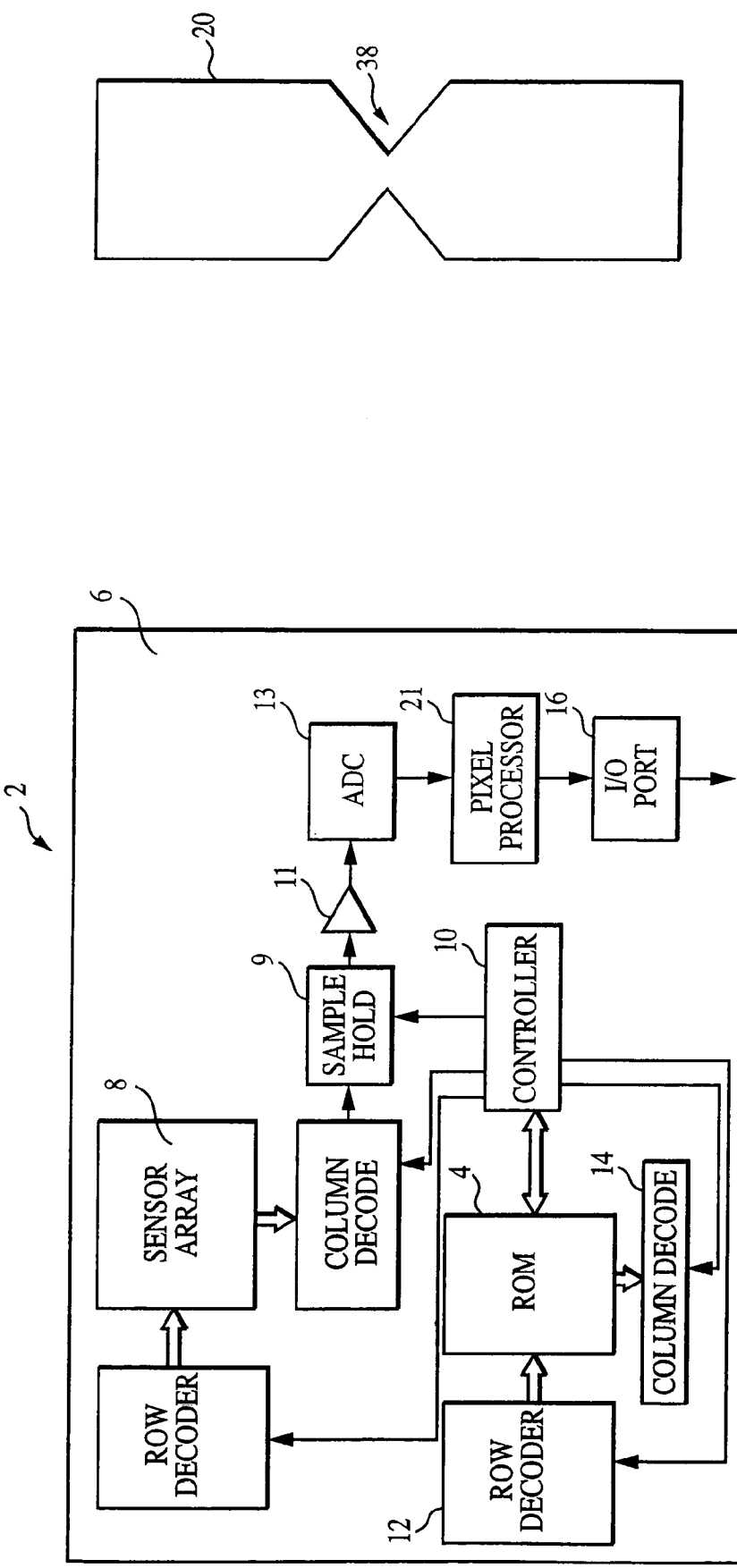
FIG. 1 is a simplified block diagram of an imaging sensor with an on-chip ROM in accordance with an exemplary embodiment of the invention.

Referring initially to FIG. 1, a block diagram is shown of an image sensing device 2 with an on-chip pixel sensor array 8, controller 10, input/output port and associate interface 16 and a ROM 4 in accordance with an exemplary embodiment of the present invention. Imaging sensor 2 preferably is formed by a CMOS process on a semiconductor substrate 6 (e.g., silicon substrate). The pixels within a sensor array 8 may be formed with photodiodes as the light sensing element. Controller 10 operates the row and column decoders and other signals to enable read out of analog pixel read out and charge accumulation signals row-by-row and column-by-column within a row to sample and hold circuit 9 as known in the art. The output of sample and hold circuit is amplified by amplifier 11 and is converted to digital signals by analog-to-digital converter 13. A pixel processor 21 digitally process the pixel information and supplies it to I/O port 16. Controller 10 also accesses memory cells of ROM 4 through a row address decoder 12 and a column address decoder 14. As shown in FIG. 1, ROM 4 is included on semiconductor substrate 6 along with imaging sensor 8 and controller 10 and other imager components.

Figure 2:
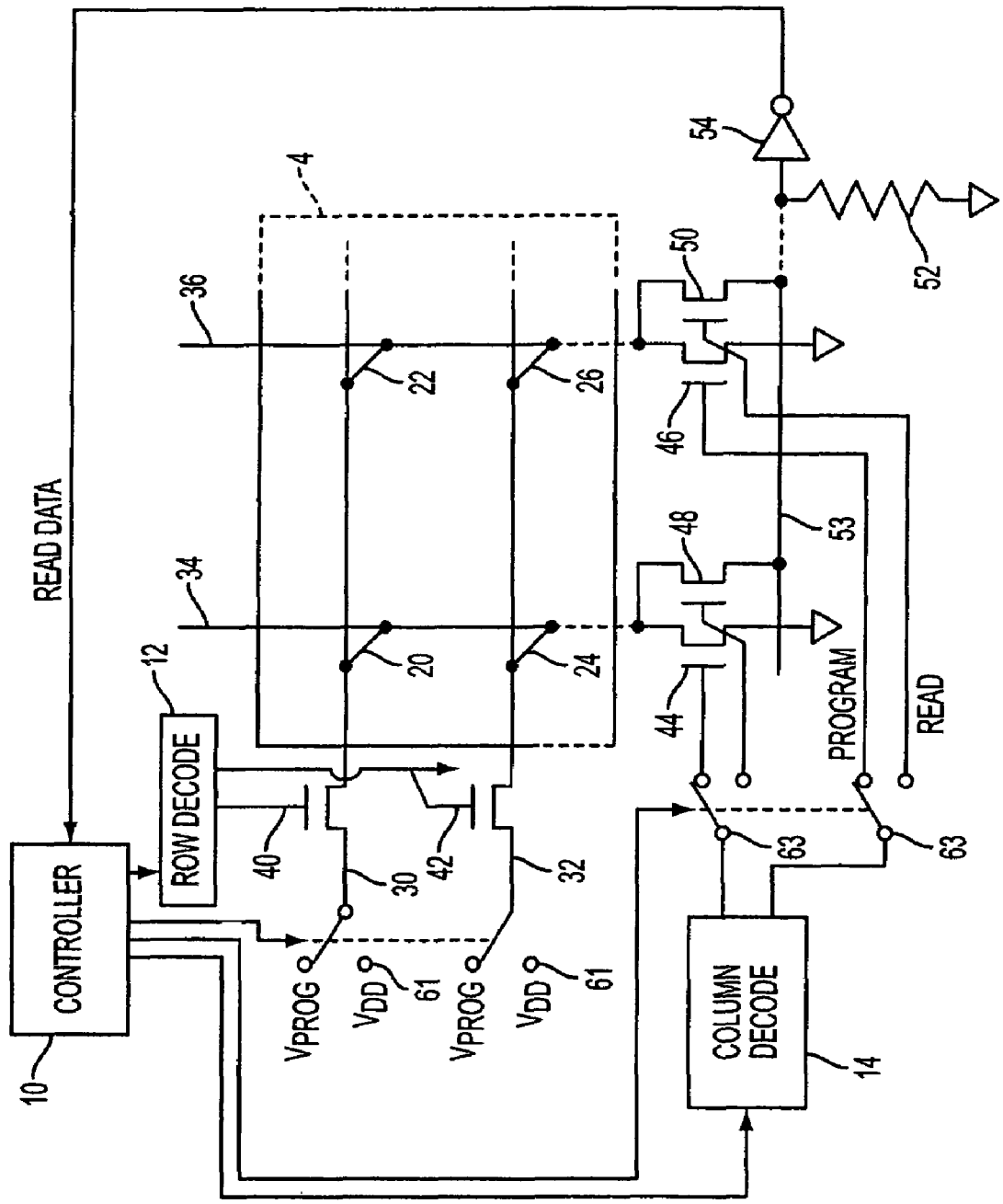
FIG. 2 is a schematic diagram of on-chip ROM and a read/write circuit as used in the imaging sensor of FIG. 1 in accordance with an exemplary embodiment of the invention.

A circuit diagram of a portion of ROM 4 is shown in FIG. 2. ROM 4 includes an array of breakable fuses arranged in rows and columns. Each breakable fuse represents a memory cell of the ROM 4. Representative fuses are designated as 20, 22, 24, and 26 in FIG. 2, although the fuse array can be extended to any number of rows and columns as determined by data storage requirements and space limitations. Each fuse is coupled between a row line and a column line. Fuse 20, for example, is coupled between row line 30 and column line 34. The fuse array is formed on-chip during fabrication of the other components shown in FIG. 1.

An example of an individual fuse (e.g., fuse 20 of FIG. 2) is illustrated in FIG. 3. Fuse 20 is a conductor formed of, for example, polysilicon, and includes a narrowed portion 38 which is subject to breakage when a high voltage is applied across the fuse. The fuse 20 is shown as having a polysilicon strip portion 38 necked down by a pair of V-shaped notches, providing a simple, easily manufactured fuse arrangement. Other arrangements which allow for fuse severance using an elevated voltage may also be used.

During data storage operations of the ROM 4, individual fuses are selected for writing by way of row and column switching transistors accessed by controller 10 through row and column address decoder 12, 14. Individual rows are selected by way of row access transistors 40 and 42, for example, coupled to rows 30 and 32, respectively. Individual columns are selected by column transistors 44 and 46, having one source/drain connection coupled to columns 34 and 36, respectively and the other source/drain connection connected to ground. When a row transistor and a column transistor are both selected, Vprog, representing a voltage which is higher than a read voltage, is supplied to the fuse, through the row transistor, e.g., 40 and to ground through the column transistor, e.g., 44. Vprog is of sufficient magnitude to break the narrowed section of the polysilicon fuse. Programming continues in this manner until all of the data is stored appropriately in the fuse array as fuse elements which are broken or not in a data information pattern.

Data stored in ROM 4 is accessed by the row and column decoders 12, 14 and reading the selected fuse and/or fuses to determine the stored data. A blown fuse, having a high resistance and a large voltage drop, is read as one logic state (e.g., 1), while a non-blown fuse having a low resistance is read as another logic state (e.g., 0). When a particular fuse is selected for reading, a voltage Vdd is applied to the fuse from the row line, which voltage is lower than the programming voltage Vprog. The contents of the memory cells are (e.g., logic HIGH, or logic LOW) are read column by column onto line 53 by switching transistors 48, 50. Line 53 is connected to inverter 54 which provides a logic output signal in accordance with a broken or unbroken state of read fuses 54.

As best shown in FIG. 2, the programming and read out of ROM memory 4 occurs under control of a program and read out circuit which may conveniently be implemented within controller 10 which supplies row and column addresses for programming and read out functions to row 12 and column 14 decoders, and which controls transistor switches 61 to supply either a programming voltage Vprog or a read voltage Vdd to the source terminals of the row select transistors 40, 42, depending on whether a programming or read out operation is to occur. Controller 10 also controls transistor selection switches 63 to supply a selected column line signal from column decoder 14 to one of a programming column select switch, e.g., 44 or a read column select switch, e.g., 48, again depending on whether a programming or read out operation is to occur. The program and read out circuit for ROM memory 4 can also be implemented independently of controller 10.

Pixel formation which can be stored in the ROM according to the present invention includes identification data concerning manufacturing conditions and test results. Test results can include defective pixel location and types of defects. Information on pixel dark currents can be stored, as well as reference temperature at which the pixels generate a desired output voltage under predetermined illumination conditions. Pixels that generate hot spots on dark spots can also be identified in the ROM, along with data indicating signal intensity. Also, package/die information can be stored, along with camera information when the imager is used with a camera. ROM row or column redundancy information can also be stored in the form of programmed replacement rows or columns of memory elements.

Although breakable fuses formed of polysilicon have been disclosed above, any conductor used in the CMOS process can be used, as long as it can be configured to break under the noted programming conditions and can be read as described.

The present invention provides a simple apparatus and method for storing data regarding a CMOS sensor array 8 in an on-chip ROM 4.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. For example, while the fuse conductors are disclosed as being made of polysilicon, any other suitable material may be used in its place. Accordingly, the invention is not to be considered as limited by the foregoing description but is only limited by the scope of the appended claims.

What is claimed as new and desired to be protected by Letters Patent of the United States is:

1. An imaging system comprising:
an integrated circuit comprising:
an array including a plurality of pixels; and
a programmable non-volatile memory located on the integrated circuit for storing information relating to said array, said memory including:
a plurality of rows and columns of addressable fuses connected between a respective pair of row and column lines;
a plurality of row access transistors wherein a single row access transistor is coupled by a source/drain connection to a respective row line of the array;
a plurality of column access transistors each coupled by a source/drain connection to a respective column line of the array;
a second plurality of column access transistors each having one source/drain terminal connected to a respective column line and another source/drain terminal connected to an output line for read out of data from said fuses; and
a control circuit arranged and configured to selectively operate said row and column access transistors to provide a voltage at a first level through a respective row access transistor, a respective column access transistor, and access a selected fuse sufficient to break the selected fuse during a programming operation.

2. An imaging system as in claim 1, wherein said control circuit is arranged and configured to select a row access transistor to apply a voltage at said first level to a respective row line during a programming operation and to select a column access transistor to couple a respective column line to a second voltage during said programming operation.

3. An imaging system as in claim 2, wherein said second voltage is ground.

4. An imaging system as in claim 1, wherein said control circuit is further arranged and configured to selectively operate said column access transistors to provide a voltage of a second level, lower than the first level, through the respective row access transistor, and across the selected fuse link during a read operation.

5. An image sensing device comprising:
an array of pixels fabricated on an integrated circuit chip;
a programmable read-only memory fabricated on the chip, the read-only memory comprising:
 an array of fuses, arranged in a plurality of rows and columns;
 a plurality of row access transistors each respectively coupled to one of said rows of the array;
 a plurality of column transistors each coupled by a source/drain connection to a respective column of the array, wherein the selected column transistor being used with the selected row access transistor to program a fuse link associated with the selected row and column;
 a plurality of column read transistors coupled by a source/drain connection respectively to each column of the array, a selected column read transistor being used with the selected row access transistor to provide a read potential lower than the programming potential through the selected row access transistor and the column read transistor to a fuse defined by a selected row and column, the read potential being insufficient to break the respective fuse; and
 access circuitry coupled to said transistors for writing and reading programming information to and from the read only memory.

6. An image sensing device as in claim 5, wherein said access circuitry comprises control circuitry for selecting individual fuses.

7. An image sensing device as in claim 5, wherein said read-only memory stores pixel defect information.

8. An image sensing device as in claim 5, wherein said read-only memory stores pixel light sensitivity information.

9. An image sensing device as in claim 5, wherein said read-only memory stores pixel dark current information.

10. An image sensing device as in claim 5, wherein said read-only memory stores information relating to the identification of pixels having hot spots.

11. An image sensing device as in claim 5, wherein said read-only memory stores an identification of pixels having dark spots.

12. An image sensing device as in claim 5, wherein said read-only memory stores information concerning a camera with which said image sensing device is used.

13. An image sensing device as in claim 5, wherein said read-only memory stores reference temperature information.

14. An image sensing device as in claim 5, wherein said read-only memory stores memory redundancy information.

15. An image sensing device as in claim 5, wherein said read-only memory stores identification information associated with said integrated circuit.

16. A method of fabricating an image sensing device comprising:
fabricating an array of an image sensor having an array of pixel cells arranged in a plurality of rows and columns;
fabricating a programmable non-volatile memory including a plurality of rows and columns of addressable fuses connected between a respective pair of row and column lines;
fabricating a plurality of row access transistors, where each one of said row access transistors is connected to one of said plurality of rows;
fabricating a plurality of column transistors, where at least one of said column transistors is connected to a respective column line; and
fabricating a plurality of second column transistors, where at least one of said second column transistors is connected to a respective column line; and
fabricating a control circuit arranged and configured to selectively operate said row and column transistors to provide a first voltage level to a selected fuse sufficient to break a fuse link during a programming operation and to operate said row and second column transistors to provide a second voltage level across the selected fuse link insufficient to break the link during a read operation.

17. An image sensing device comprising:
an integrated circuit comprising:
 a pixel sensor array;
 circuitry for progressing signals from said pixel sensor array; and
 a programmable read only memory for storing information relating to the processing of signals from said pixel sensor array, said programmable read only memory comprising:
  rows and columns of signal lines having an array of electrically breakable fuses respectively connected between predetermined row and column lines;
  a plurality of row access transistors wherein a single row access transistor is coupled by a source/drain connection to a respective one of said row lines;
  a plurality of column transistors wherein at least one of said transistors is coupled by a source/drain connection to a respective column line of the array;
  a second plurality of column access transistors each having one source/drain terminal connected to a respective column line and another source/drain terminal connected to an output line for read out of data from said fuses; and
  control circuitry for programming said fuse array by selectively breaking fuses of said array.

18. A method of programming and reading an image sensing device comprising:
providing representative signals of light incident upon an array of pixels;
storing information associated with the sensor array in a read only memory comprising:
 coupling a single row access transistor to a respective row line of the array;
 coupling a read transistor to a respective column line of the array for reading from the column line;
 coupling a write transistor to a respective column line of the array for writing to the column line;
 providing fuse links across respective row and column lines; and
 providing a voltage at a first level through a respective row access transistor and a respective write transistor and across a selected fuse link sufficient to break the selected fuse link during a programming operation and for selectively operating said row access transistor to provide a voltage of a second level, insufficient to break a fuse link, through a respective row transistor, a respective read transistor, and across a selected fuse link during a read operation.

* * * * *